United States Patent [19]

Namiki et al.

[11] Patent Number: 5,055,329

[45] Date of Patent: Oct. 8, 1991

[54] IMAGE-RECEIVING SHEET MATERIAL AND PROCESS FOR THE FORMATION OF A TRANSFERRED IMAGE

[75] Inventors: Tomizo Namiki; Tamotsu Suzuki; Masashi Katayama, all of Shizuoka, Japan

[73] Assignee: Fuji Photo Film Co., Ltd., Kanagawa, Japan

[21] Appl. No.: 494,390

[22] Filed: Mar. 16, 1990

[30] Foreign Application Priority Data

Mar. 17, 1989 [JP] Japan ................................. 1-65066

[51] Int. Cl.$^5$ ...................... G03C 11/12; B32B 9/04; A61F 13/02
[52] U.S. Cl. ..................................... 428/42; 428/409; 428/484; 428/500; 430/257; 430/259; 430/260; 430/262; 430/263
[58] Field of Search ............... 430/259, 260, 262, 263, 430/257; 428/42, 409, 484, 500; 156/235, 241

[56] References Cited

U.S. PATENT DOCUMENTS

| | | | |
|---|---|---|---|
| 3,721,557 | 3/1973 | Inoue et al. | 430/257 |
| 4,482,625 | 11/1984 | Namiki et al. | 430/260 |
| 4,766,053 | 8/1988 | Shinozaki et al. | 430/262 |
| 4,877,712 | 10/1989 | Namiki et al. | 430/262 |
| 4,933,258 | 6/1990 | Shinozaki et al. | 430/262 |

*Primary Examiner*—Richard L. Schilling
*Attorney, Agent, or Firm*—Sughrue, Mion, Zinn, Macpeak & Seas

[57] ABSTRACT

An image-receiving sheet material to be used for the formation of a transferred image by transferring a transferable image formed on an image-forming layer of a photo-sensitive material onto the image-receiving sheet material and then retransferring the image onto a permanent substrate, wherein the image-receiving sheet material comprises a substrate and first and second image-receiving layers located adjacent each other and comprising organic high polymer(s), wherein the second image-receiving layer is to be transferred onto the permanent substrate and further comprises at least one of the following components (I) and (II):

(I) one or more compounds represented by general formula $R_1$—X, wherein X is —$CH_2OR_2$, —COOH or —$CONH_2$; $R_1$ is a monovalent hydrocarbon group of $C_nH_{2n+1}$ or $C_nH_{2n-1}$, wherein n is an integer of from 11 to 21; $R_2$ is a hydrogen atom or —CO—$R_3$—S—$R_3$—COOCH$_2$—$R_1$; and $R_3$ is a divalent hydrocarbon group having from 1 to 6 carbon atoms; and (II) a wax or a hardened oil comprising at least one selected from a saturated hydrocarbon mixture containing straight-chain hydrocarbons, the mixture having an average number of carbon atoms per each of the straight-chain hydrocarbons of 20 or above and each of the straight-chain hydrocarbons having a molecular weight of 300 or above and a saturated hydrocarbon mixture containing branched hydrocarbons or cyclic hydrocarbons, the mixture having an average number of carbon atoms per each of the branched or cyclic hydrocarbons of 35 or above and each of the branched or cyclic hydrocarbons having a molecular weight of 500 or above.

1 Claim, No Drawings

IMAGE-RECEIVING SHEET MATERIAL AND PROCESS FOR THE FORMATION OF A TRANSFERRED IMAGE

FIELD OF THE INVENTION

This invention relates to a transfer material which is mainly applied to a color proof for color correction or display.

BACKGROUND OF THE INVENTION

A method is known that comprises subjecting a sensitive laminate, wherein a peel layer comprising an organic polymer and a sensitive resin layer are located on a provisional substrate, to exposure and development so as to form an image on the peel layer and then transferring the image onto an arbitrary substrate. These methods are described, for example, in JP-B-46-15326 (the term "JP-B" as used herein means an "examined Japanese patent publication") and JP-B-49-441 (corresponding to U.S. Pat. No. 3,721,557). These methods are advantageous in that they are applicable not only to overlay type processes but also to surprint type processes such as for a color proof. However, they have some disadvantages in that it is required to use an adhesive upon each transfer, which makes the procedure troublesome, and in that the accuracy of site matching upon the transfer of each color is low.

In order to avoid the above-mentioned troublesome procedure, JP-A-47-41830 (the term "JP-A" as used herein means an "unexamined published Japanese patent application"), JP-A-48-93337 and JP-A-51-5101 each disclose a method wherein an image, which has been formed on an image-receiving sheet, is transferred by applying heat and pressure to the image-forming sheet. JP-A-51-5101, in particular, discloses a method comprising locating a hot-melt polymer layer as an adhesive on a permanent substrate, while JP- A-47-41830 discloses a method whereby an image is directly transferred to a permanent substrate such as art paper or coated paper.

However, these methods have the following disadvantages. One of these disadvantages resides in that the final image thus obtained is in the reverse of its original right and left. Further, the use of the hot-melt polymer having a high melting point elevates the transfer temperature. As a result, the dimensional stability of the substrate is lowered, which causes a deviation in the site matching of the transfer of each color. On the other hand, the use of a polymer having a low melting point frequently causes adhesion or scratches after the formation of an image. JP-A-59-97140 (corresponding to U.S. Pat. No. 4,482,625) discloses a method for improving over these disadvantages.

In this method, an image of each color is transferred once onto a provisional image-receiving sheet provided with a photopolymerizable receiving layer, and then, the image is retransferred onto the permanent substrate and subjected to overall exposure to thereby solidify the photopolymerizable image-receiving layer.

This method is highly effective in solving the above-mentioned problems. Namely, it makes it possible to provide a positive image of the mask original. Furthermore, since an ethylenically polyfunctional monomer is used in this method, the photopolymerizable image-receiving layer per se is soft at the transfer and makes it possible to conduct the transfer at a low temperature. Subsequently, the photopolymerizable receiving layer is solidified through exposure. Thus, the layer has a high resistance against adhesion and scarcely suffers from scratches.

JP-A-61-189535 (corresponding to U.S. Pat. No. 4,766,053) discloses an image-receiving sheet having a two-layer image-receiving layer comprising organic polymers located on a substrate. By using this image-receiving sheet upon the transfer of an image onto a permanent substrate, it may be arbitrarily selected either to transfer the second receiving layer onto the image layer or to transfer the image layer alone, by appropriately controlling the peeling between the receiving layers and that between the second layer and the image layer.

However, each of the above-mentioned methods, wherein the second image-receiving layer has a tackiness or a hot-adhesiveness which allows the hot adhesion thereof to the transferable image, has the following disadvantages.

(1) When the film surface of the transferable image sheet is located on the image-receiving surface of the image-receiving sheet and conducted to thermal transfer therewith, the tackiness of the image-receiving surface causes the incorporation of air-bubbles between the film surfaces, which are simply called hereinafter bubbles. As a result, the qualities of the image obtained are sometimes deteriorated.

(2) When an image is retransferred onto a permanent substrate, the second image-receiving layer has a thermal adhesiveness which remains on the image, which sometimes causes adhesion problems of the final products which are piled together and stored at a high temperature or a high humidity.

SUMMARY OF THE INVENTION

It is an object of the present invention to improve the above-mentioned disadvantages. Namely, the present invention aims at providing an image-receiving sheet material to be used in a process for the formation of a transferred image showing the unevenness of a substrate and highly approximate to a printed one which comprises transferring a transferable image onto an image-receiving sheet material and conducting interlayer peeling of an image-receiving layer upon the retransfer of the image onto a permanent substrate (for example, paper, metal plate, plastic film, fabric) without requiring any matting process, whereby the incorporation of bubbles between film surfaces can be inhibited upon the transfer of the image without deteriorating the image transferability and a final product highly resistant against adhesion can be obtained.

The above-mentioned object of the present invention has been achieved by providing an image-receiving sheet material to be used in a process for the formation of a transferred image by transferring a transferable image formed on an image-forming layer on a photosensitive material onto the image-receiving sheet material and then retransferring the image onto a permanent substrate, wherein the image-receiving sheet material comprises a substrate and first and second image-receiving layers located adjacent each other and comprising organic high polymer(s), wherein the second image-receiving layer is to be transferred onto the permanent substrate, and further comprises at least one of the following components (I) and (II):

(I) one or more compound(s) represented by the general formula $R_1-X$, wherein X is $-CH_2OR_2$, —COOH or —CONH$_2$; R$_1$ is a monovalent hydrocarbon group of C$_n$H$_{2n+1}$ or C$_n$H$_{2n-1}$, wherein n is an integer of from 11 to 21; R$_2$ is a hydrogen atom or —CO—R$_3$—S—R$_3$—COOCH$_2$—R$_1$; and R$_3$ is a divalent hydrocarbon group having from 1 to 6 carbon atoms; and (II) a wax or a hardened oil comprising a saturated hydrocarbon mixture containing straight-chain hydrocarbons, the mixture having an average number of carbon atoms per each of the straight-chain hydrocarbons of 20 or above and a each of the straight-chain hydrocarbons having a molecular weight of 300 or above and/or a saturated hydrocarbon mixture containing branched hydrocarbons or cyclic hydrocarbons, the mixture having an average number of carbon atoms per each of the branched or cyclic hydrocarbons of 35 or above and a each of the branched or cyclic hydrocarbons having molecular weight of 500 or above.

Also provided is a process for the formation of a transferred image comprising: (1) transferring a transferable image formed on an image-forming layer on a photo-sensitive material onto the image-receiving sheet material, and then (2) retransferring the image onto a permanent substrate, wherein the image-receiving sheet material is that described above.

DETAILED DESCRIPTION OF THE INVENTION

The substrate of the image-receiving sheet should be made of a flexible material stable to heat and chemicals. It may be permeable to actinic rays, if required. Particular examples thereof include polyolefins (for example, polyethylene, polypropylene), polyvinyl halides (for example, polyvinyl chloride, polyvinylidene chloride), cellulose derivatives (for example, cellulose acetate, nitrocellulose, cellophane), polyamides, polystyrene, polycarbonate and polyimides. In addition, it is sometimes possible to use a paper on which a polyethylene film is laminated. Among these materials, a biaxially oriented polyethylene terephthalate film is particularly preferable from the viewpoints of dimensional stability and permeability, though the present invention is not restricted thereto. It is further possible to subject the substrate to a surface treatment such as a corona treatment or a glow treatment or to form an undercoat layer so as to enhance the adhesivity of the substrate to the first image-receiving layer. Although any undercoat layer may be used therefor so long as it can enhance the adhesivity of the substrate to the first image-receiving layer, a silane coupling agent is particularly suitable therefor.

The thickness of the substrate of the image-receiving sheet used in the present invention is preferably within the range of about 50 to 300 μm.

The organic high polymer to be used in the first image-receiving layer may be preferably selected from among those having a softening point, determined by Vicat's method (ASTMD 1235: Determination of softening point of polymer), of approximately 80° C. or below. This is because the use of a polymer having a low softening point makes it possible to improve the adhesion of an image-receiving sheet material, onto which a transferable image has been transferred, to a permanent substrate such as a paper to which the layer is to be transferred under heat and pressure, since the layer can be embedded along the unevenness of the paper. Furthermore, in this case, no matting step is required upon peeling and the image thus obtained is highly approximate to a printed one. When a polymer of a high softening point is used, on the other hand, the transfer should be conducted at a high temperature, which seriously lowers, for example, the dimensional stability of the image. When a polyethylene terephthalate film is to be used as a substrate for a sensitive material or an image-receiving sheet material, therefore, the organic high polymers should be selected from among those having a softening point of approximately 80° C. or below, preferably 60° C. or below and still preferably 50° C. or below. Examples of organic high polymers having a softening point of approximately 80° C. or below may be selected from among polyolefins (for example, polyethylene, polypropylene), ethylene copolymers (for example, ethylene/vinyl acetate, ethylene/acrylate), polyvinyl chloride, vinyl chloride copolymers (for example, vinyl chloride/vinyl acetate), polyvinylidene chloride, vinylidene chloride copolymers, polystyrene, styrene copolymers (for example, styrene/(meth)acrylate), polyvinyltoluene, vinyltoluene copolymers (for example, vinyltoluene/(meth)acrylate), poly(meth)acrylate, (meth)acrylate copolymers (for example, butyl (meth)acrylate/vinyl acetate), vinyl acetate, polyamide resins (for example, nylon, copolymers of nylon, N-alkoxymethylated nylon), synthetic rubbers, and chlorinated rubbers. Furthermore, organic high polymers having a softening point of approximately 80° C. or below described in *Plastic Performance Handbook* (ed. by The Japanese Plastic Industry Association and the Japanese Plastic Molding Industry Association, published by Industrial Search Co., Oct. 25, 1968) may be used therefor. It is also possible to add various plasticizers compatible with these organic high polymers so as to substantially lower the softening point thereof. It is further possible to add a compatible plasticizer(s) to an organic high polymer having a softening point of approximately 80° C. or above so as to substantially control the softening point thereof to 80° C. or below. Furthermore, it is possible to add various polymers, adhesion improvers, surfactants and/or mold release agents to the first image-receiving layer to thereby control the adhesivity thereof to the substrate of the image-receiving sheet or to the second image-receiving layer, so long as the substantial softening point thereof does not exceed approximately 80° C. Typical examples of these additions are described, for instance, in U.S. Pat. No. 4,766,053 and JP-A-1-52135 in detail.

The thickness of the organic high polymer employed as the first layer may preferably range from 1 to 50 μm, still preferably from 5 to 30 μm. One of the reasons therefor resides in that the thickness of the first layer should exceed the unevenness on the surface of the permanent substrate, when an image transferred onto the image-receiving sheet material is to be retransferred onto the permanent substrate. Another reason therefor is that the first layer is preferably 4 times as thick as that of the unevenness in the streaked part and unstreaked part of each color upon the transfer of a transferable image showing the uneven streaked parts and unstreaked parts onto the image-receiving sheet material, particularly in the case where four colors overlap each other as observed in color proofing, though a thin first layer may be used in the case of a monochrome transfer.

Now the second image-receiving layer to be formed on the first image-receiving layer will be described. The purpose of the organic high polymer of the second image-receiving layer is to give an image which has a gloss closely approximate to that of a printed one by taking advantage of the unevenness of the permanent substrate, without requiring any matting procedure, by conducting interlayer peeling between the first and second image-receiving layers upon the retransfer of the image onto the permanent substrate so as to leave the thin second layer alone on the image on the permanent substrate. Accordingly, it may be selected from a number of organic high polymers, so long as it satisfies the relationship such that the interlayer peelings are controlled thereby as described in JP-A-61-189535. However, it should be appropriately selected depending on the material for the first image-receiving layer, the process for the formation of a transferable image, the material for the image-forming part or the permanent substrate (for example, art paper, coated paper, fine paper, pulp paper, metal plate, synthetic film), by taking the material for the first layer or the process for the formation of a transferable image into consideration. From the viewpoint of keeping qualities (adhesion resistance) of the image formed on the permanent substrate, it is preferable that the softening point of the second layer is not excessively low. By considering the image transferability, the organic high polymer to be used for the second image-receiving layer may be preferably selected from among materials having a softening point higher than that of the first layer at least by 10° C.

Particular examples of the organic high polymer to be used as the second image-receiving layer may be selected from among polyolefins (for example, polyethylene, polypropylene), ethylene copolymers (for example, ethylene/vinyl acetate, ethylene/acrylate), polyvinyl chloride, vinyl chloride copolymers (for example, vinyl chloride/vinyl acetate), polyvinylidene chloride, vinylidene chloride copolymers, polystyrene, styrene copolymers (for example, styrene/(meth)acrylate), polyvinyltoluene, vinyltoluene copolymers (for example, vinyltoluene/(meth)acrylate), poly(meth)acrylates, (meth)acrylate copolymers (for example, butyl (meth)acrylate/vinyl acetate), vinyl acetate, polyamide resins (for example, nylon, copolymers of nylon, N-alkoxymethylated nylon), synthetic rubbers; chlorinated rubbers, and cellulose derivatives. The organic high polymer is preferably contained in the second image-receiving layer in an amount of at least 60 wt %.

It is preferable that the organic high polymer to be used for the second layer is selected from among those having a softening point higher than that of the organic high polymer to be used for the first layer, which is determined by Vicat's method and is lower than approximately 80° C., by at least 10° C.

The further components to be added to the second image-receiving layer employed in the present invention are (I) and/or (II) as follows.

(I) one or more compound(s) represented by the general formula $R_1$—X, wherein X is —$CH_2OR_2$, —COOH or —$CONH_2$; $R_1$ is a monovalent hydrocarbon group of formula $C_nH_{2n+1}$ or $C_nH_{2n-1}$, wherein n is an integer of from 11 to 21; $R_2$ is a hydrogen atom or —CO—$R_3$S—$R_3$—$COOCH_2$—$R_1$; and $R_3$ is a divalent hydrocarbon group having from 1 to 6 carbon atoms.

(II) a wax or a hardened oil comprising a saturated hydrocarbon mixture containing straight-chain hydrocarbons, the mixture having an average number of carbon atoms per each of the straight-chain hydrocarbons of 20 or above and each of the straight-chain hydrocarbons having a molecular weight of 300 or above as the main components and/or a saturated hydrocarbon mixture containing branched hydrocarbons or cyclic hydrocarbons, the mixture having an average number of carbon atoms per each of the branched or cyclic hydrocarbons of 35 or above and each of the branched or cyclic hydrocarbons having a molecular weight of 500 or above as the main components.

These compounds and the addition amounts thereof may be appropriately selected depending on the composition of the second image-receiving layer to be used as a base, by taking the solubility thereto and the effect of relieving the tackiness into consideration. Generally speaking, a compound carrying a smaller number of carbon atoms would show a higher solubility but a lower effect of relieving the tackiness. When the number of carbon atoms increases, on the other hand, the effect of relieving the tackiness would be elevated but the second image-receiving layer might sometimes become turbid, thus deteriorating the image transferability. From the viewpoint of the balance of the solubility with the effect of relieving the tackiness, the carbon atom number of $R_1$ in the above general formula may preferably range from 11 to 21. Compounds wherein X represents a —$CH_2OH$, —COOH or —$CONH_2$ group and a thiodiester of the following formula:

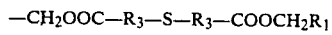
$$-CH_2OOC-R_3-S-R_3-COOCH_2R_1$$

are particularly preferable, since they are highly effective in relieving the tackiness. Furthermore, compounds wherein X is a —$CH_2OH$ or —COOH group and $R_1$ is a $C_{13}$ to $C_{17}$ group, those wherein X is a —$CONH_2$ and $R_1$ is a saturated $C_{13}$ hydrocarbon or an unsaturated $C_{17}H_{33}$ hydrocarbon group and a thiodiester wherein $R_1$ is a $C_{11}$ to $C_{17}$ group and $R_3$ is a $C_3$ group are particularly effective, since they are highly effective in relieving the tackiness and are highly soluble in resins. Any one of these compounds or a mixture thereof may be used. Particular examples thereof include lauryl alcohol, myristyl alcohol, cetyl alcohol, stearyl alcohol, eicosyl alcohol, lauric acid, myristic acid, palmitic acid, stearic acid, eicosanoic acid, lauramide, myristamide, palmitamide, stearamide, dilauryl thiodipropionate, dimyristyl thiodipropionate, distearyl thiodipropionate, oleyl alcohol, erucyl alcohol, oleic acid, erucic acid, oleamide, erucamide, linolic acid, linolamide, linolenic acid and linolenamide.

Examples of the wax include paraffin wax and microrystalline wax, while examples of the hardened oil include hardened beef tallow oil and hardened castor oil.

When the above-mentioned component(s) are added to the second image-receiving layer composition in a total amount of less than about 0.1% by weight based on the base composition, no substantial effect for relieving the tackiness is observed. When the amount of the compound(s) exceeds about 10% by weight, on the other hand, the tackiness-relieving effect is fully achieved but the poor solubility of the additive(s) in the base composition makes the resin turbid. In this case, therefore, the image transferability is deteriorated. The optimum amount of these additives should be determined based on each resin, since the solubilities of the additives will vary depending on the structure of the base composition. Generally speaking, it is preferable to add 0.1 to 10% by weight, still preferably 0.5 to 4% by weight, of these additives, from the viewpoint of the tackiness-relieving effect and the hot adhesivity of the second image-receiving layer to the image-forming layer on a photo-sensitive material.

Needless to say, it is further possible to add various additives (for example, an adhesion improver, a mold releasing agent, plasticizers, surfactants) to these resins so as to satisfy the relationship of adhesivity specified in JP-A-61-189535.

In addition, a third image-receiving layer comprising organic high polymer(s) may be formed on the second one so as to control the film properties (for example, tackiness, hot adhesion, film strength) of the second image-receiving layer. The organic high polymer(s) to be used as the third image-receiving layer may be suitably selected from those as illustrated in the above second image-receiving layer, preferably those having a softing point lower than that of the second layer by at least 10 °C.

Furthermore, it is effective to make the second and third image-receiving layers photopolymerizable. In this case, the adhesion resistance of the final product can be improved by photosetting these image-receiving layers after the transfer onto the permanent substrate. Photopolymerizable monomers and photopolymerization initiators available for this purpose are described in U.S. Pat. No. 4,482,625 and JP-A-61-200535.

The thickness of the second layer may preferably range from 0.1 to 10 μm, still more preferably from 0.5 to 5 μm. When the second layer is excessively thick, the similarity to the unevenness on the surface of the permanent substrate is deteriorated. Then the final product thus obtained has excessive gloss and is not approximate to a printed one. On the contrary, when the film is too thin, the image-transferring properties and the surface gloss of the transferred image are deteriorated due to a low film strength. When two or more image-receiving layers are to be transferred to the permanent substrate, the total film thickness preferably falls within the above-mentioned range.

As described above, various methods shown in the references cited above (e.g., U.S. Pat. No. 4,482,625) may be employed for the formation of the transferable image to be used in the present invention. It is particularly preferable that a peel layer is formed on the substrate of the photo-sensitive material in the thickness of about 0.3 to 5 μm. When there is no peel layer on a substrate upon retransferring, the image per se should be thermally transferred onto the permanent substrate. As a number of tests indicate, the range for selecting the material for the permanent substrate is considerably restricted and/or a high thermal transfer temperature should be employed in this case. When a peel layer is used, on the other hand, the functions may be easily divided. Therefore, the range of the latitude of temperature or the material for the permanent substrate may be advantageously enlarged. When a photographic image is formed, the peel layer in the unstreaked part may be etched upon development and that in the streaked part may remain alone. Alternately, the peel layer may not be etched upon the development and thus a color image may be formed on the peel layer.

In order to conduct the interlayer peeling of the image-receiving sheet material between the first and second image-receiving layers upon the transfer to the permanent substrate, it is important to control the adhesivities between the layers. In order to control the interlayer adhesivity, it is effective to select appropriate application solvents so as to inhibit the mixing at the laminating application, as conducted in the present invention. In addition, it is effective therefor to select appropriate materials, for example, a combination of a hydrophilic polymer (a polar polymer, for example, polyamide or polyvinyl butylal) with a lipophilic polymer (a nonpolar polymer, for example, polyethylene, polystyrene, polyvinyl chloride or ethylene/vinyl acetate copolymer) and to add various additives (for example, an adhesion improver such as a silane coupling agent, fluorine or a silicone mold releasing agent, surfactants, plasticizers) to the first or second image-receiving layer.

To further illustrate the present invention, and not by way of limitation, the following Examples will be given.

Unless otherwise indicated, all percents, ratios, parts, etc. are by weight.

First, a transferable image forming material was prepared in the following manner. A solution for the peel layer of the following composition was applied on a polyethylene terephthalate substrate (thickness: 100 μm) and dried to thereby give a peel layer of 0.5 μm in dry film thickness.

| Coating solution for peel layer | |
|---|---|
| Alcohol-soluble polyamide (CM-8000, "η" 20° C., in 10 % by weight methanol solution = 23 cps, mfd. by Toray Industries, Inc.) | 7.2 g |
| Polyhydroxystyrene (Resin M, average molecular weight: 5500, mfd. by Maruzen Oil Co., Ltd.) | 1.8 g |
| Methanol | 400 g |
| Methyl cellosolve | 100 g |

Next, four coating solutions of yellow (Y), magenta (M), cyan (C) and black (B), each having the composition specified in Table 1, were applied on the peel layer and dried so as to give each a photo-sensitive resin layer of 2.4 μm in dry film thickness.

Further, a coating solution of the following composition was applied on each photo-sensitive resin layer and dried to thereby give a protective layer of 1.5 μm in dry film thickness.

TABLE 1

| | Y (g) | M (g) | C (g) | B (g) |
|---|---|---|---|---|
| Benzyl methacrylate/methacrylic acid copolymer (molar ratio: 73/27, viscosity η: 0.12) | 60 | 60 | 60 | 60 |
| Pentaerythritol tetraacrylate | 43.2 | 43.2 | 43.2 | 43.2 |
| Michler's ketone | 2.4 | 2.4 | 2.4 | 2.4 |
| 2-(o-Chlorophenyl)-4,5-diphenyl imidazole dimer | 2.5 | 2.5 | 2.5 | 2.5 |
| Seika First Yellow H-0755 (mfd. by Dainippon Seika Kogyo K.K.) | 9.4 | — | — | — |
| Seika First Carmine 1483 (mfd. by Dainippon Seika Kogyo K.K.) | — | 5.2 | — | — |
| Cyanine Blue 4820 (mfd. by Dainippon Seika Kogyo K.K.) | — | — | 5.6 | — |
| Mitsubishi carbon Black KA-100 (mfd. by Mitsubishi Chemical Industries, Ltd.) | — | — | — | 6.6 |

TABLE 1-continued

|  | Y (g) | M (g) | C (g) | B (g) |
|---|---|---|---|---|
| Methyl cellosolve acetate | 560 | 560 | 560 | 560 |
| Methyl ethyl ketone | 280 | 280 | 280 | 280 |

Note:
Viscosity η means the intrinsic viscosity in a methyl ethyl ketone solution at 25° C.

| Coating solution for protective layer | |
|---|---|
| Polyvinyl alcohol (GL-05, mfd. by Nippon Gosei Kagaku Kogyo K.K.) | 60 g |
| Water | 970 g |
| Methanol | 30 g |

Thus, photo-sensitive transfer sheets (N→P type colored photo-sensitive sheets) of the four colors, each comprising the substrate, the peel layer, the photo-sensitive resin layer and the protective layer in this order, were prepared.

Each of these photo-sensitive transfer sheets was placed on the corresponding mask with register pins and exposed to an ultra-high pressure mercury lamp (2 kW) for 30 seconds placed 50 cm away.

The transfer sheet thus exposed was then developed with the use of a developing solution of the following composition at 35° C. for 10 to 20 seconds. Thus, four color positive images were obtained on the peel layers.

| Developing solution | |
|---|---|
| Na$_2$CO$_3$ | 15 g |
| Butyl cellosolve | 1 g |
| Water | 1 liter |

On the other hand, an image-receiving sheet material was prepared in the following manner. Coating solution A of the following composition for the first image-receiving layer was applied on a polyethylene terephthalate film (thickness: 100 μm) and dried to thereby give the first image-receiving layer of 20 μm in dry film thickness.

| Coating solution A | |
|---|---|
| Ethylene/vinyl acetate copolymer (weight ratio: ethylene/vinyl acetate = 81/19, "EVAFLEX #410" mfd. by Mitsui Polychemical Co., Ltd.) | 15 g |
| Chlorinated polyethylene ("SUPERCHLON #907LTA" mfd. by Sanyo-Kokusaku Pulp Co., Ltd.) | 0.075 g |
| Fluorine surfactant ("FLUORAD FC-430, mfd. by 3M Co.) | 0.25 g |
| Toluene | 100 cc |

Next, compounds (a) to (e) of the present invention were respectively added to a mother liquor B for the second image-receiving layer so as to give coating solutions. Then, each coating solution was applied on the above first image-receiving layer to thereby give the second image-receiving layer of 2 μm in dry film thickness.

Added compound*
(a) stearic acid (m.p.: 56-60° C.)

-continued (b) behenic acid (m.p.: 76-81° C.)
(c) oleamide (m.p.: 72-76° C.)
(d) stearamide (m.p.: 99-105° C.)
(e) hardened castor oil (m.p.: >84° C.)

| Mother liquor B | |
|---|---|
| Alcohol-soluble nylon ("AMILAN CM-8000" mfd. by Toray Industries, Inc.) | 1.5 g |
| Styrene/maleate semiester copolymer ("Oxylac SH-101" mfd. by Nippon Shokubai K.K.) | 1.5 g |
| Compound of the invention* | 0.03 g |
| Methyl alcohol | 70 ml |
| Methyl cellosolve | 30 ml |

For comparison, another second image-receiving layer containing no compound of the invention was further prepared.

The image-receiving face of each of the image-receiving sheets of the present invention and the comparative sample was located on the image face of a color proofing sheet, on which a black image had been formed, with register pins upon site-matching. Then, the black image was transferred onto the image-receiving sheet with a color art transferring machine (CA-600T: mfd. by Fuji Photo Film Co., Ltd.). Then, the black image was completely transferred from the color proofing sheet to the image-receiving sheet together with the peel layer.

Subsequently, color proofing sheets, on which cyan, magenta and yellow images had been formed, were located on the black image thus transferred and the same procedure was repeated. Thus, each color image was completely transferred onto the image-receiving sheet together with the peel layer so as to give a four-color image.

Further, the image face of the image-receiving sheet having the four color transferred image was placed on white art paper and the same transfer procedure as the one described above was conducted. When the image-receiving sheet was peeled, the first image-receiving layer alone remained on the substrate. Namely, the image and the second image-receiving layer located thereon were observed on the permanent substrate.

The degree of bubble-formation upon the transfer process and the degree of the adhesion of the image face, after allowing the image face of a white art paper placed on another white art paper to stand at 40° C. and 75% RH applying a load of 1.5 kg/5×5 cm$^2$ for 72 hours, were evaluated. Table 2 summarizes the results.

TABLE 2

| Compound | Bubble-formation | Adhesion of Image |
|---|---|---|
| Ex. 1 (a) stearic acid | no | trace |
| Ex. 2 (b) behenic acid | no | no |
| Ex. 3 (c) oleamide | no | no |
| Ex. 4 (d) stearamide | no | no |
| Ex. 5 (e) hardened castor oil | no | no |
| Comp. no addition | yes | paper-peeling |

As Table 2 obviously indicates, each sample, wherein the compound of the present invention was added to the second image-receiving layer, showed no bubble-formation in the image of the final product and a high adhesion resistance, namely, high keeping qualities.

While the invention has been described in detail and with reference to specific examples thereof, it will be apparent to one skilled in the art that various changes and modifications can be made therein without departing from the spirit and scope thereof.

What is claimed is:

1. An image-receiving sheet material to be used for the formation of a transferred image by transferring a transferable image formed on an image-forming layer of a photo-sensitive material onto said image-receiving sheet material and the retransferring said image onto a permanent substrate, wherein said image-receiving sheet material comprises a substrate and first and second image-receiving layers located adjacent each other and comprising organic high polymer(s), wherein said second image-receiving layer is to be transferred onto the permanent substrate and further comprises at least one of the following components (I) and (II):

(I) one or more compounds represented by general formula $R_1$—X, wherein X is —$CHR_2OR_2$, —COOH or —$CONH_2$; $R_1$ is a monovalent hydrocarbon group of $C_nH_{2n+1}$ or $C_nH_{2n-1}$, wherein n is an integer of from 11 to 21; $R_2$ is a hydrogen atom or —CO—$R_3$—S—$R_3$—$COOCH_2$—$R_1$; and $R_3$ is a divalent hydrocarbon group having from 1 to 6 carbon atoms; and (II) a wax or a hardened oil comprising at least one selected from a saturated hydrocarbon mixture containing straight-chain hydrocarbons, said mixture having an average number of carbon atoms per each of said straight-chain hydrocarbons of 20 or above and each of said straight-chain hydrocarbons having a molecular weight of 300 or above and a saturated hydrocarbon mixture containing branched hydrocarbons or cyclic hydrocarbons, said mixture having an average number of carbon atoms per each of said branched or cyclic hydrocarbons of 35 or above and each of said branched or cyclic hydrocarbons having a molecular weight of 500 or more.

* * * * *